United States Patent
Pearson et al.

(10) Patent No.: US 9,038,407 B2
(45) Date of Patent: May 26, 2015

(54) ELECTRO-HYDRODYNAMIC COOLING WITH ENHANCED HEAT TRANSFER SURFACES

(71) Applicant: Hamilton Sundstrand Corporation, Windsor Locks, CT (US)

(72) Inventors: Matthew Robert Pearson, Hartford, CT (US); Mohsen Farzad, Glastonbury, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 209 days.

(21) Appl. No.: 13/644,105

(22) Filed: Oct. 3, 2012

(65) Prior Publication Data

US 2014/0090403 A1    Apr. 3, 2014

(51) Int. Cl.
*F25B 21/00* (2006.01)
*H01L 23/473* (2006.01)

(52) U.S. Cl.
CPC ....... *H01L 23/473* (2013.01); *H01L 2924/0002* (2013.01)

(58) Field of Classification Search
CPC .............. H01L 23/473; H01L 2924/0002; H01L 2924/00
USPC ............... 62/3.1, 259.2; 165/104.33, 104.24, 165/80.4; 417/50, 53
See application file for complete search history.

(56) References Cited

U.S. PATENT DOCUMENTS

| | | | |
|---|---|---|---|
| 6,265,025 B1 | 7/2001 | DePaoli et al. | |
| 6,409,975 B1 | 6/2002 | Seyed-Yagoobi et al. | |
| 6,443,704 B1 | 9/2002 | Darabi et al. | |
| 6,932,580 B2 | 8/2005 | Yagoobi et al. | |
| 6,942,018 B2 | 9/2005 | Goodson et al. | |
| 6,991,024 B2 | 1/2006 | Goodson et al. | |
| 7,004,238 B2 | 2/2006 | Seyed-Yagoobi et al. | |
| 7,126,822 B2 | 10/2006 | Hu et al. | |
| 7,131,486 B2 | 11/2006 | Goodson et al. | |
| 7,185,697 B2 | 3/2007 | Goodson et al. | |
| 7,261,521 B2 | 8/2007 | Yagoobi | |
| 7,334,630 B2 | 2/2008 | Goodson et al. | |
| 7,492,594 B2 | 2/2009 | Pal | |
| 7,549,298 B2 * | 6/2009 | Bash et al. | 62/121 |
| 7,579,077 B2 * | 8/2009 | Dubrow et al. | 428/357 |
| 7,661,468 B2 | 2/2010 | Schlitz | |

(Continued)

FOREIGN PATENT DOCUMENTS

JP    2012057872 A    3/2012

OTHER PUBLICATIONS

European Search Report for European Application No. 13186904.2 mailed Jan. 12, 2015.

*Primary Examiner* — Mohammad M Ali
(74) *Attorney, Agent, or Firm* — Carlson, Gaskey & Olds, PC

(57) ABSTRACT

The electronic control has an electric control which incorporates circuitry which will generate heat in use. A cooling channel placed in contact with at least one surface on the electric control. The cooling channel has a portion which receives an enhanced heat transfer surface. At least one electrode pair is mounted on an inlet channel portion upstream of the portion of the channel that receives the enhanced heat transfer surface. A source of current is provided for the electrode. The electrode induces an electric field in the inlet channel, to drive a dielectric fluid across the enhanced heat transfer surfaces.

5 Claims, 1 Drawing Sheet

(56) References Cited

U.S. PATENT DOCUMENTS

| | | | |
|---|---|---|---|
| 7,679,910 B2 * | 3/2010 | Chen | 361/700 |
| 7,802,970 B2 | 9/2010 | Singhal et al. | |
| 7,929,305 B1 | 4/2011 | Pal | |
| 7,974,095 B2 * | 7/2011 | Murata | 361/699 |
| 8,053,938 B2 | 11/2011 | Pal et al. | |
| 8,171,745 B2 | 5/2012 | Schroder | |
| 2002/0122728 A1 | 9/2002 | Darabi et al. | |
| 2003/0206807 A1 | 11/2003 | Yagoobi et al. | |
| 2004/0120827 A1 | 6/2004 | Kim et al. | |
| 2006/0044759 A1 * | 3/2006 | Chebiam et al. | 361/699 |
| 2008/0283225 A1 * | 11/2008 | Ma et al. | 165/104.33 |
| 2012/0180978 A1 | 7/2012 | Gavillet et al. | |

\* cited by examiner

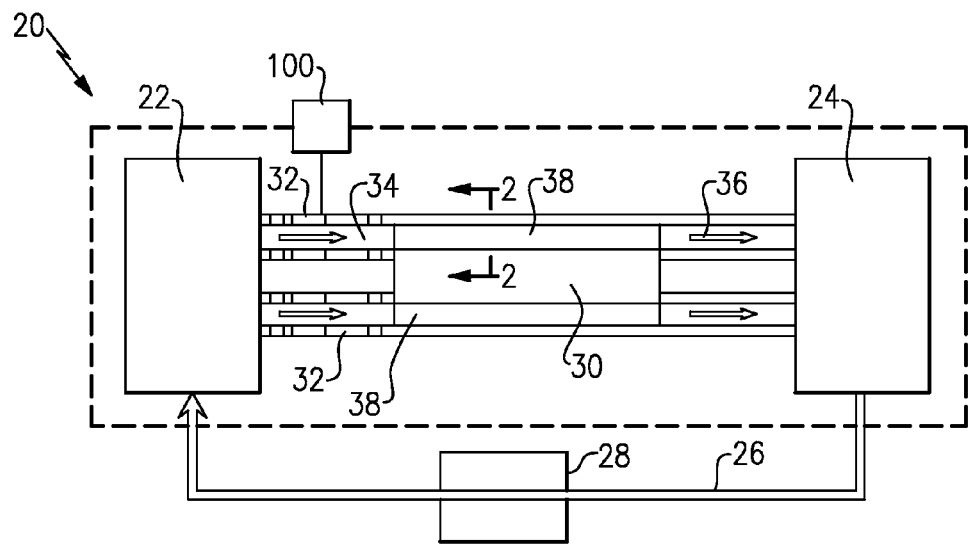
FIG. 1
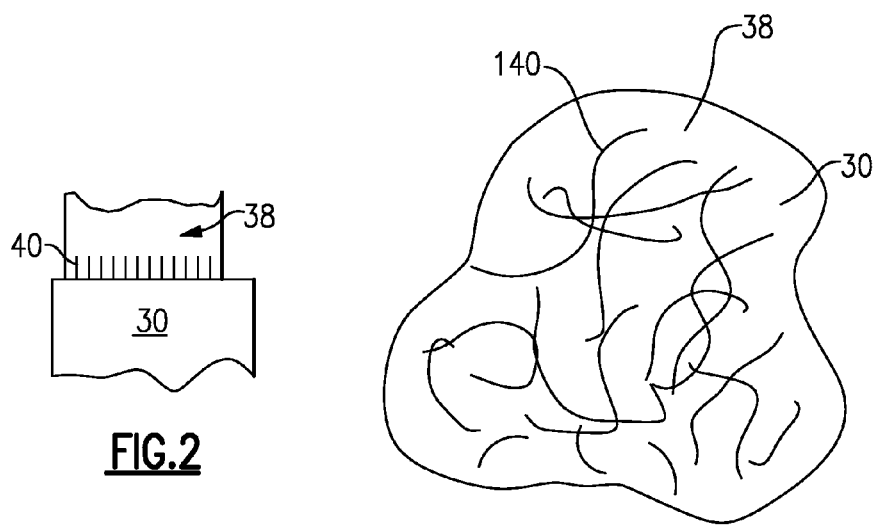
FIG. 2
FIG. 3

ELECTRO-HYDRODYNAMIC COOLING WITH ENHANCED HEAT TRANSFER SURFACES

BACKGROUND OF THE INVENTION

This application relates to improvements to cooling systems which utilize electro-hydrodynamic conduction pumping.

The thermal management of electronics presents a large and growing challenge. High power density electronics create an increase in the heat flux generated by electronic devices, such that passive cooling may no longer be sufficient. Thermal management limitations are beginning to present a ceiling from electronics reaching full capacity.

As an example, clock speeds on central processing units have been reduced, and the power rating for power electronic components has been restricted. The theoretical operating limits of the electronic devices far exceed what is possible to implement with present cooling solutions.

Fluid pumping has been proposed, however, most mechanical pumps raise reliability issues, and can introduce noise, vibration and other challenges.

Electro-hydrodynamic conduction pumping has been proposed for cooling electric components. In general, electro-hydrodynamic conduction pumping is provided by a solid-state pumping device with no moving parts that can be easily embedded in cooling channels, thereby eliminating the need for a mechanical pump. This reduces the complexity of the cooling system and allows it to be neatly packaged.

Most dielectric liquids have a slight electric conductivity due to ionic impurities. These ions can be driven to move when an electric field is supplied, and this can result in bulk liquid motion, or pumping.

Various arrangements for electro-hydrodynamic conduction pump have been proposed in the prior art, and including for cooling electronics.

SUMMARY OF THE INVENTION

An electronic control and cooling circuit has an electric element which will generate heat in use. A channel is placed in contact with at least one surface on the electric element. A portion of the channel includes an enhanced heat transfer surface. At least one electrode pair is mounted on a channel portion upstream of the portion of the channel that receives the enhanced heat transfer surface. The electrode pair induces an electric field in an inlet portion of the channel, to drive a dielectric fluid across the enhanced heat transfer surface.

These and other features of this application will be best understood from the following specification and drawings, the following of which is a brief description.

BRIEF DESCRIPTION OF THE DRAWINGS

FIG. 1 shows an electrohydrodynamic pumping system for use in cooling an electronic control.
FIG. 2 is a cross-sectional view along line 2-2 of FIG. 1.
FIG. 3 shows another embodiment.

DETAILED DESCRIPTION

A cooling system 20 is disclosed in FIG. 1 having an inlet plenum 22 delivering a fluid through cooling channels 38 toward an outlet plenum 24. A return line 26 returns the fluid to the inlet plenum 22 through a heat exchanger 28. A fan or other method of moving a fluid over the heat exchanger 28 to remove heat may be included.

An electronic element 30 is cooled by the system 20. Element 30 may be a circuit board, a power controller, or other elements which generate heat. As shown, the inlet plenum 22 communicates with inlet channels 34, then into cooling channels 38 associated with surfaces of the electronic element 30. The fluid flows to an outlet channel 36, communicating with the outlet plenum 24. As shown in FIG. 1, there are channels 38 on opposed sides of the electric control 30. Of course, there are applications where the channel is only on one side.

Surfaces of the channels 38 that contact the electronic element 30 are provided with enhanced heat transfer surfaces. One embodiment is shown in FIG. 2. Nanofibers 40 are included along a surface of the channel portion 38 which contacts the electric control 30. Other ways of providing enhanced heat transfer surfaces, such as etched surfaces, may be utilized.

Electrode pairs 32 are associated with the inlets 34, and create an applied electric field, which drives a liquid across the enhanced heat transfer surfaces 40 in the channels 38, and into the outlets 36 due to electrohydrodynamic conduction pumping. A control and power supply 100 drives the electrodes 32. In one embodiment, the liquid is a dielectric liquid.

The channels 38 may also be provided on all sides of the electric control 30.

The channel may be on the order of several tens or hundreds of micrometers, while the enhanced heat transfer surfaces are much smaller, both measured in a direction extending away from electronic element 30. As an example, the fibers in 40 may have an average diameter on the order of 10 to 1000 nanometers. In embodiments, these fibers may only cover a small fraction of the channel height near the electronic control 30, or they may fill the entire cross-sectional area of the channel such that all of the fluid moving through channel 38 must travel in the spacing between individual fibers that fill the channel. A ratio of the "height," or distance away from the electric element of the surfaces compared to the overall height of the channel 38 receiving the enhanced heat transfer surfaces is between 0.1 and 1.

The enhanced heat transfer surfaces in combination with the electrode 42 mounted immediately upstream of the channel 38 results in a very compact and easily sealed design that will improve heat transfer between the element 30 and the fluid in channels 38 and remove a significant quantity of heat. FIG. 3 shows another embodiment wherein a nanomat 140 is utilized. Rather than having the nanofibers standing alone such as in FIG. 2, the nanomat has randomly distributed fibers, which also have an average diameter on the order of 10-1000 nanometers. The length of these fibers may be significantly longer than the channel height, but they are arranged to form the nanomat such that the overall height of the nanomat is also consistent with the FIG. 2 embodiment. The nanomat 140 is included within the channel 38, and sits on a surface of the element 30.

In embodiments, the electronic element 30 may include central processing units, power electronic components such as IGBTs, MOSFETs, and diodes, or any other component that is dissipating heat.

The nanomat 140 or fibers 40 may be formed of plastic, copper, or some other appropriate material. Nanomats are known, and may be formed by spinning techniques.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. An electronic element and cooling system comprising:
an electric element which will generate heat in use;
a cooling channel placed in contact with at least one surface on said electric element, and said cooling channel having a portion receiving an enhanced heat transfer surface;
at least one electrode pair mounted on an inlet channel upstream of said portion of said cooling channel receiving said enhanced heat transfer surface, and a source of current for said electrode, said electrode for inducing an electric field in said inlet channel to drive a fluid across said enhanced heat transfer surfaces due to electrohydrodynamic conduction pumping; and
wherein a height of said enhanced heat transfer surfaces is defined in a direction measured away from said at least one surface of said electric element and a ratio of said height of said enhanced heat transfer surfaces to a height of said portion of said cooling channel receiving said enhanced heat transfer surfaces is between 0.1 and 1.

2. An electronic element and cooling system comprising:
an electric element which will generate heat in use;
a plurality of cooling channels placed in contact with surfaces on said electric element, and said cooling channels each having a portion receiving an enhanced heat transfer surface;
an electrode mounted on an inlet channel upstream of said portion of each said cooling channel receiving said enhanced heat transfer surface, and a source of current for said electrodes, said electrodes for inducing an electric field in said inlet channels to drive a dielectric fluid across said enhanced heat transfer surfaces;
said cooling mounted on opposed sides of said electric element;
said cooling channels communicate with an outlet plenum, and said outlet plenum communicating with an inlet plenum, said inlet plenum communicating with said inlet channels;
a heat exchanger mounted on a return line which communicates said outlet plenum back to said inlet plenum; and
said enhanced transfer heat surfaces include nanofibers with a height of said fibers defined in a direction measured away from said surfaces of said electric control, and a ratio of said height of said nanofibers to a height of each said portion of said cooling channels receiving said enhanced heat transfer surfaces is between 0.1 and 1 and an average diameter of said nanofibers being between 10 to 1000 nanometers.

3. The electronic element as set forth in claim 2, wherein said nanofibers are part of a nanomat.

4. The electronic element as set forth in claim 2, wherein said nanofibers are formed of a plastic or metal.

5. The electronic element as set forth in claim 4, wherein said nanofibers are formed of copper.

* * * * *